United States Patent [19]

McClure

[11] Patent Number: 5,124,584
[45] Date of Patent: Jun. 23, 1992

[54] ADDRESS BUFFER CIRCUIT WITH TRANSITION-BASED LATCHING

[75] Inventor: David C. McClure, Carrollton, Tex.

[73] Assignee: SGS-Thomson Microelectronics, Inc., Carrollton, Tex.

[21] Appl. No.: 601,287

[22] Filed: Oct. 22, 1990

[51] Int. Cl.[5] .................... H03K 19/00; H03K 19/092
[52] U.S. Cl. .................................. 307/480; 307/475; 365/230.08; 365/233.5
[58] Field of Search ............... 307/480, 269, 475, 443, 307/265, 272.1; 365/189.05, 230.08, 233, 233.5

[56] References Cited

U.S. PATENT DOCUMENTS

| | | | |
|---|---|---|---|
| 4,592,028 | 5/1986 | Konishi | 365/233.5 |
| 4,922,122 | 5/1990 | Dubujet | 307/480 |
| 4,922,461 | 5/1990 | Hayakawa et al. | 365/230.08 |
| 5,003,513 | 3/1991 | Porter et al. | 365/233.5 |

OTHER PUBLICATIONS

Okuyama, et al., "A 7.5-ns 32K×8 CMOS SRAM", *IEEE Journal of Solid-State Circuits* (Oct. 1988), vol. 23, No. 5, pp. 1054-1059.

Kohno, et al., "A 14-ns 1-Mbit CMOS SRAM with Variable Bit Organization", *IEEE Journal of Solid-State Circuits* (Oct. 1988), vol. 23, No. 5, pp. 1060-1066.

Williams, et al., "An Experimental 1-Mbit CMOS SRAM with Configurable Organization and Operation", *IEEE Journal of Solid-State Circuits* (Oct. 1988), vol. 23, No. 5, pp. 1085-1094.

Primary Examiner—Edward P. Westin
Assistant Examiner—Richard Roseen
Attorney, Agent, or Firm—Rodney M. Anderson; Lisa K. Jorgenson; Richard K. Robinson

[57] ABSTRACT

An input buffer circuit having a latching function controlled by a transition detection circuit is disclosed. The input stage of the input buffer is connected to a delay stage, and to a transition detection circuit. The output of the delay stage is connected to a pass gate, which is controlled by the output of the transition detection circuit; a latch is connected to the other side of the pass gate. The transition detection circuit produces a pulse responsive to a transition, and the pass gate is turned off during the length of the pulse, with the latch maintaining and presenting the state of the input prior to the transition. After the pulse is complete, the new value of the input signal is latched and presented to the circuit. Since the pass gate is turned off during the transition detection pulse, a short and spurious transition at the input terminal is isolated from the latch by the pass gate (with the transition detection pulse lengthened), and does not appear at the output of the input buffer circuit.

21 Claims, 2 Drawing Sheets

ADDRESS BUFFER CIRCUIT WITH TRANSITION-BASED LATCHING

This invention is in the field of integrated circuits, and is more specifically directed to input buffers in said circuits.

BACKGROUND OF THE INVENTION

Many modern integrated circuits are designed to perform their operations in response to input signals which are applied to terminals at relatively high frequencies (e.g., on the order of tens of MHz), and in an asynchronous or unclocked manner. One type of such integrated circuits is a static random-access memory, commonly referred to as an SRAM. SRAMs are designed to receive address values at address terminals, and to statically provide read or write access to the memory cells corresponding to the value of the address applied thereto. Accordingly, such SRAM circuits are designed to quickly respond to the address value applied thereto, without relying on a clock signal indicating that the value at its address terminals is valid.

In addition, it should be noted that the timing of address signals presented to an SRAM can vary widely. For example, a series of addresses may be presented to the SRAM at a high rate (e.g., 20 MHz), followed by a relatively long period of inactivity at the address terminals. During the period of inactivity, conventional fully static SRAMs maintain access to the memory cells selected by the address value which is maintained at the address terminals (unless otherwise controlled by a chip select or output enable signal).

In order to reduce power during such relatively long periods at which the address values are not changing, and also to provide the performance benefits of internal dynamic operation, many modern SRAMs include an address transition detection (ATD) circuit. The ATD circuit detects transitions at certain inputs to the SRAM, particularly the address terminals, and generates an internal signal responsive to detecting such a transition. The use of an ATD circuit allows the SRAM circuit to perform certain internal operations, such as precharging bit lines, deselecting sense amplifiers, and the like, after detection of the address transition, but before the decoders access the desired cell; alternatively, these internal operations may be done after a timeout period has expired in a memory cycle. Upon presentation of a new memory address to the SRAM, the transitions at the address terminal cause the ATD circuit to enable the necessary functions of the SRAM to access the memory cells selected by the new memory address. Examples of SRAMs controlled by such an ATD circuit are described in Okuyama et al., "A 7.5-ns 32K×8 CMOS SRAM," *IEEE J. Solid State Circuits*, Vol. 23, No. 5 (October 1988), pp. 1054–1059, Kohno et al., "A 14-ns 1-Mbit CMOS SRAM with Variable Bit Organization," *IEEE J. Solid State Circuits*, Vol. 23, No. 5 (October 1988), pp. 1060–1066, and Williams et al., "An Experimental 1-Mbit CMOS SRAM with Configurable Organization and Operation", *IEEE J. Solid State Circuits*, Vol. 23, No. 5 (October 1988), pp. 1085–1094, all incorporated herein by this reference.

For such circuits as SRAMs, including those which utilize an ATD circuit, noise or other spurious signals at the input terminals can cause significant problems, if the circuit attempts to respond to the spurious signal. This is due to the design of these circuits to respond to unclocked signals, such as addresses; in contrast, clocked circuits receive a clock signal indicating, for example, that the value at the address terminals is valid, allowing the circuit to ignore noise and other transitions at these terminals at other times in the cycle.

In particular, if high frequency address transitions are applied to some conventional SRAMs, whether intentionally applied or resulting from noise, "race" conditions in these memories can improperly energize multiple word lines in the memory array, causing destruction of the stored data in some memory cells, as well as potential high current damage in the circuit. Prior techniques, including the forcing off of all wordlines during the latter part of the memory cycle (e.g,. during equilibration), may not be effective to defeat multiple word line selection if the response of the address input buffers is sufficiently fast.

Additional problems in SRAM devices may also be caused by high frequency address transitions. During a write operation, the address value must be maintained for a period of time after application of the write enable signal to allow time for the input data to reach the selected memory cell. In the event of noise at the address terminals of sufficient amplitude to cause a transition during such a write operation, data may be written into the wrong memory location. Also, high frequency address terminal transitions during a read operation may cause undesired transitions at the output terminals of the SRAM circuit. These transitions generate additional noise which may cause further undesired transitions in the circuit, and potentially resulting in oscillation of the circuit.

It is therefore an object of this invention to provide control of the input buffers of an integrated circuit so that high frequency transitions are ignored.

It is a further object of this invention to provide control of the input buffers of an integrated circuit in such a manner that timing constraints and race conditions resulting from address transitions, for example at the end of a write operation, are alleviated.

It is a further object of this invention to provide such control in a manner which does not significantly slow down the operation of the circuit to valid input transitions.

Other objects and advantages of the invention will be apparent to those of ordinary skill in the art having reference to this specification, together with its drawings.

SUMMARY OF THE INVENTION

The invention may be incorporated into an input buffer for an integrated circuit which includes an address transition detection (ATD) circuit. The ATD circuit generates a pulse responsive to a transition at the address terminals, which controls a pass gate connected between the input stage of the buffer and a latch. The pass gate is controlled so that it is off during the ATD pulse, preventing an address transition from reaching the latch until after completion of the ATD pulse. The latch maintains the prior state at the output of the input buffer until the pass gate is turned back on at the end of the ATD pulse. In addition, if the transition at the address terminal is of higher frequency than the ATD pulse, the ATD circuit lengthens the ATD pulse so that the latch is isolated from the input buffer, thus preventing the latch from being reset by the high frequency transition.

DETAILED DESCRIPTION OF THE PREFERRED EMBODIMENT

Figure 1:
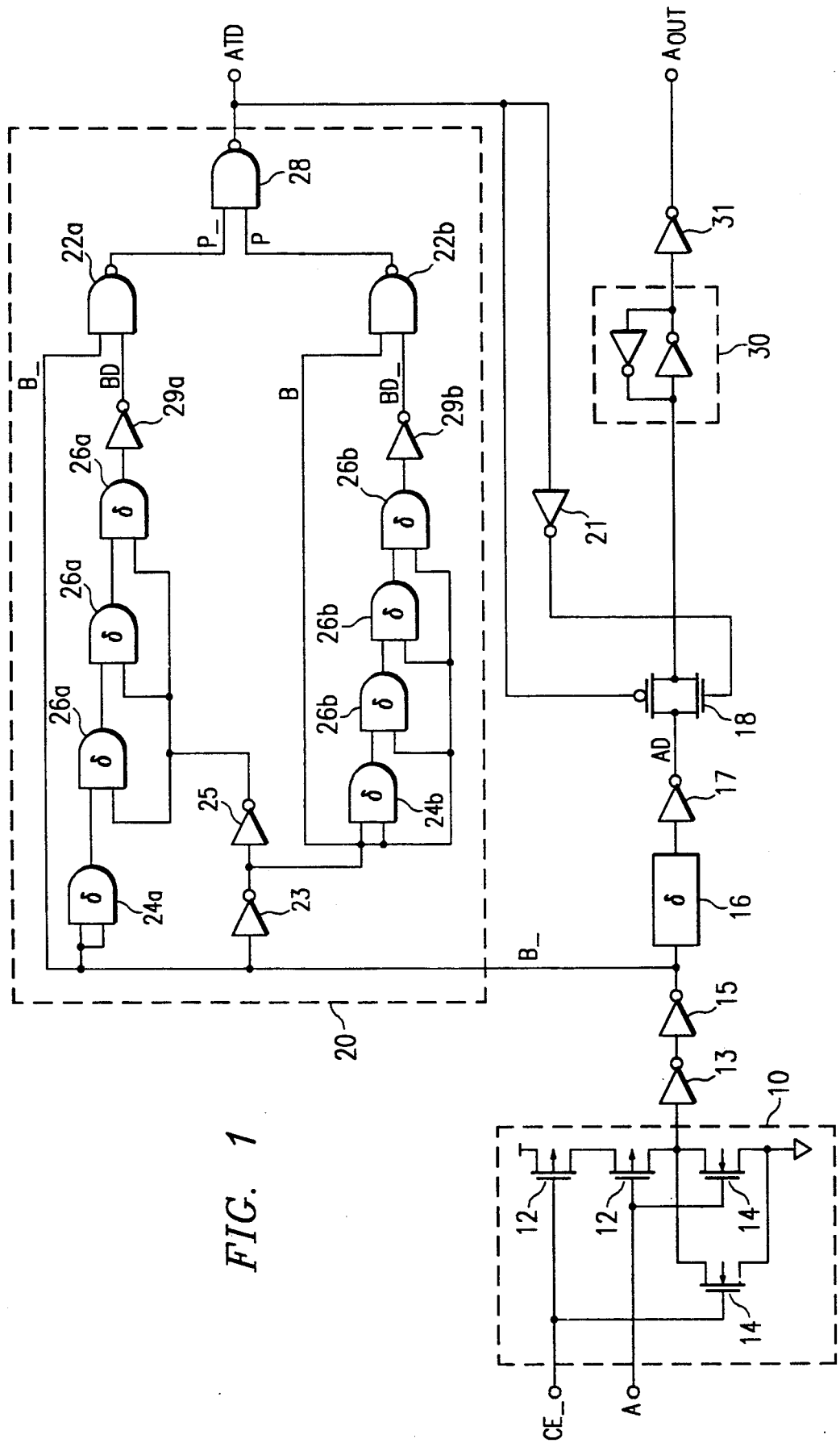
FIG. 1 is an electrical diagram, in schematic form, of an input buffer circuit constructed according to the preferred embodiment of the invention.

Referring to FIG. 1, an input buffer circuit according to the preferred embodiment of the invention, which may be included in an integrated circuit such as an SRAM, is schematically illustrated. The operation of this circuit utilizes the observation that it is beneficial to generate an address transition detection (ATD) pulse as quickly as possible after a transition at one of the address terminals, but that the new value at the address terminals need not be presented to nodes internal to the integrated circuit as quickly as the ATD pulse is generated. This observation is especially valid for high density SRAM circuits. Accordingly, the present invention utilizes the ATD pulse to control the application of the new address value to the output of the input buffer in such a manner that spurious high frequency transitions at the address terminals are ignored.

The input buffer circuit of FIG. 1 is for one of the address terminals of an integrated circuit such as an SRAM. A conventional NOR gate input stage 10 receives the state of the address terminal A, and a chip enable line CE_ which is communicated from a chip enable terminal buffered by an input buffer (not shown). Input stage 10 is a conventional CMOS two-input NOR gate, including series p-channel pull-up transistors 12 connected between $V_{cc}$ and the output of input stage 10, and parallel n-channel pull-down transistors 14 connected between ground and the output of input stage 10; the gates of the transistors in each leg are controlled by chip enable line CE_ and the address terminal A. The relative gain of the n-channel transistors 14 to the p-channel pull-up transistors 12 is preferably selected so that input stage 10 responds to address terminal A according to a particular specification, such as TTL input levels. Input stage 10 performs the logical NOR of address terminal A and of chip enable line CE_ (a low logic level on line CE_ indicating enable of input stage 10, and a high logic level indicating disable of input stage 10).

The output of input stage 10 is connected to the input of inverter 13, which has its output connected to the input of inverter 15; the output of inverter 15 at line B_ (indicating that line B_ corresponds to the logical complement of terminal A) is connected to ATD circuit 20, and is also passed along toward the output of the circuit as will be described hereinbelow. Inverters 13 and 15 are provided to shape the signal applied to ATD circuit 20 and to the remainder of the input buffer, converting the TTL (or other specified) input levels to CMOS or other appropriate internal logic levels. For example, inverter 15 preferably is a CMOS inverter having relatively high gain for each of the pull-up and pull-down transistors therein.

Line B_ at the output of inverter 15 is also connected to a delay stage 16. Delay stage 16 may include a series of gates, for example a series of AND gates having their inputs connected together, so that the output of delay stage 16 follows (in noninverting fashion, in this example) its input after a specified delay. The delay value of delay stage 16 is selected in cooperation with the delay in ATD circuit 20, as will be described hereinbelow.

The output of delay stage 16, inverted by inverter 17, is presented on line AD to pass gate 18. Pass gate 18 includes a p-channel transistor having its source-drain path connected in parallel with the source-drain path of an n-channel transistor; the gates of the p-channel and n-channel transistors in pass gate 18 are controlled by line ATD (inverted by inverter 21 prior to application to the gate of the n-channel transistor) from ATD circuit 20.

The opposite side of pass gate 18 from inverter 17 is connected to latch 30, which consists of cross-coupled CMOS inverters in the conventional manner. Via inverter 31, which compensates for the inversion of line AD by latch 30, the output of latch 30 drives output line $A_{out}$, which is the output of the input buffer circuit of FIG. 1. Line $A_{out}$ communicates the value of the address signal at terminal A to internal nodes of the integrated circuit incorporating the input buffer of FIG. 1. Accordingly, the control of pass gate 18 by ATD circuit 20 controls the timing at which the address signal at terminal A is communicated to nodes of the integrated circuit by the input buffer of FIG. 1.

ATD circuit 20 includes two legs, each leg terminating at a NAND gate 22. The outputs of NAND gates 22a and 22b (on lines P_ and P, respectively) are connected to inputs of NAND gate 28, the output of which drives line ATD. It should be noted that ATD circuit 20 of FIG. 1 is for a single address terminal A; similar ATD circuits are preferably provided for each input terminal at which transitions are to be detected. For purposes of controlling internal operation, the ATD signal is preferably generated from the logical OR of the lines ATD from the ATD circuit 20 for each of such terminals.

A first leg of ATD circuit 20 includes a delay gate 24a which receives line B_ at each of its inputs. The output of delay gate 24a is connected to an input of a first of a series of delay gates 26a, each of which have another input coupled to line B_ by inverters 23 and 25. Each of delay gates 24 and 26 in this preferred embodiment are AND functions, each of which include a specified amount of delay therein. The output of the last of delay gates 26a is connected to the input of inverter 29a. The output of inverter 29a, on line BD, is connected to an input of NAND gate 22a, with the other input of NAND gate 22a receiving line B_ directly, i.e. without delay by any delay gates 24 or 26. The output of NAND gate 22a, on line P_, is connected to an input of NAND gate 28.

Similarly, the other leg of ATD circuit 20 includes a first delay gate 24b which receives line B; line B is generated from line B_ by inverter 23. Line B is also connected to a first input of NAND gate 22b. The output of delay gate 24b is connected to an input of the first of a series of delay gates 26b, each of delay gates 26b also receiving line B from the output of inverter 23 at another input. The output of the last of the series of delay gates 26b drives line BD_, via inverter 29b. Line BD_ is connected to a second input of NAND gate 22b; similarly as for the first leg, the output of NAND gate 22b, on line P, is connected to an input of NAND gate 28.

The series of delay gates 26 are connected so that their inverted outputs, on lines BD_ and BD, will quickly make a transition responsive to a high-to-low transition on lines B and B_, respectively, but will make a delayed transition responsive to low-to-high transitions on lines B and B__, respectively. The benefits of this construction in controlling pass gate 18 will become apparent with the description of the operation of the circuit hereinbelow.

Referring now to the timing diagram of FIG. 2, the operation of the input buffer circuit of FIG. 1 according to this preferred embodiment of the invention will now be described. It is assumed that chip enable line CE__ is at a low logic level throughout these exemplary cycles. This example of the operation of the input buffer circuit will begin from the initial state at time $t_0$ with a high logic level at terminal A from the previous cycle, and correspondingly a high logic level at the output of the input buffer of FIG. 1 on line $A_{out}$.

In this initial state, line B__ is at a low logic level, and line B (inverted by inverter 23) is at a high logic level. Since this initial state is from a prior cycle, and assuming that this condition has been maintained for some time, delayed lines BD__ and BD are also low and high, respectively, since the delay time due to delay gates 24 and 26 has elapsed. Accordingly, line P__, corresponding to the NAND of lines B__ and BD, is at a high logic level. Also at this initial state, since lines B and BD__ are high and low respectively, line P at the output of NAND gate 22b is also at a high logic level. Accordingly, the output of NAND gate 28 is at a low logic level, which causes pass gate 18 to be conducting. The high logic level at terminal A is thus communicated from delay stage 16 into latch 30, driving a corresponding high logic level on line $A_{out}$.

The next memory access begins at time $t_1$, with a transition at address terminal A from the prior high logic level to a low logic level. Responsive to the transition of terminal A, input stage 10 and inverters 13 and 15 generate a high logic level on line B__, and a low logic level on line B. The high level on line B__ causes NAND gate 22a to change state, presenting a low logic level on line P__ to NAND gate 28; due to the delay of delay stages 24 and 26, line BD remains high for a time $t_d$ after the transition of line B__. This causes line ATD to go to a high logic level at time $t_2$, turning off pass gate 18.

It should be noted that line BD__ quickly goes high after the transition of line B, due to the connection of line B to an input of the last of delay gates 26b. The transition of line B to a low logic level causes the output of NAND gate 22b on line P to remain at its prior high level, despite the rapid transition of line BD__ to a high logic level.

The delay of delay stage 16 is preferably set at a value such that the transition at terminal A does not reach pass gate 18 until after pass gate 18 is turned off by ATD circuit 20. This is evident in the timing diagram of FIG. 2, where line AD makes the transition from a high logic level to a low logic level at time $t_3$. Since pass gate 18 is off at this time, due to line ATD being driven high by ATD circuit 20, the change of state of line AD is not communicated to the output of the input buffer on line $A_{out}$. Rather, due to the operation of latch 30, the prior state of line $A_{out}$ is maintained during such time as pass gate 18 is off, i.e., during the length of the pulse on line ATD.

The high logic level on line B__ is not only presented to one input of NAND gate 22a at time $t_2$, but also begins to ripple through delay stages 24a and 26a. After the delay time $t_d$ has elapsed from time $t_2$, occurring at time $t_4$ of FIG. 2, line BD is driven to a low logic level by inverter 29a. This causes NAND gate 22a to drive a high logic level on line P__ to an input of NAND gate 28, which in turn causes line ATD to be driven low again, since line P at the output of NAND gate 22b has remained high throughout this operation. This transition of line ATD ends the ATD pulse, and turns pass gate 18 back on, allowing the high logic level of line AD to reset latch 30, and be presented at the output $A_{out}$ to internal nodes of the integrated circuit.

Accordingly, the end of the pulse on line ATD from ATD circuit 20 controls the time at which the new value at address terminal A reaches the output of the input buffer, on line $A_{out}$. Referring to the next cycle in the example of FIG. 2, it will be evident that this control of pass gate 18 by ATD circuit 20 prevents spurious transitions at terminal A from appearing at the output of the input buffer of FIG. 1.

At time $t_5$ in this example, a short pulse at terminal A begins, with a transition at terminal A from its prior low logic level to a high logic level. In response to the transition, input stage 10 and inverters 13 and 15 drive a low logic level on line B__, and a high logic level on line B (via inverter 23). The high logic level on line B, since line BD__ remains high for a delay time $t_d$ from the low-to-high transition at line B, causes line P at the output of NAND gate 22b to go to a low logic level. This in turn causes NAND gate 28 to generate a high logic level on line ATD at time $t_6$, turning off pass gate 18. Due to the connection of line B__ (via inverters 23 and 25) to the last of the series of delay gates 26a, line BD at the output of inverter 29a quickly makes a transition to a high logic level. The high logic level on line BD does not affect the output of NAND gate 22a, since line B__ is at a low logic level.

Since pass gate 18 is turned off at time $t_6$ by line ATD going high, the subsequent transition of line AD to a high logic level at time $t_7$ is not applied to latch 30. Accordingly, a high logic level does not yet appear at the output $A_{out}$.

In this example, the spurious transition at terminal A ends at time $t_8$, with address terminal A returning to a low logic level. Such a signal at terminal A is similar to that which may occur due to noise or some other spurious coupling of a pulse to the terminal, causing a pulse thereat which is shorter than the specified hold time for a valid address change. The delay time $t_d$, which is the sum of the individual delays of gates 24 and 26 in one leg of ATD circuit 20, is selected to be consistent with the specified hold time, so that transitions of pulse widths less than delay time $t_d$ are ignored, and that transitions of pulse widths greater than time $t_d$ are assumed to be valid transitions. Due to the control of pass gate 18 by ATD circuit 20, such spurious pulses do not appear at output $A_{out}$, as will now be described.

Responsive to terminal A returning to a low logic level at the end of the spurious pulse, line B returns to a high logic level and line B returns to a low logic level. Since the delay time $t_d$ of delay stages 24b and 26b has not yet elapsed, and since line B is connected to the last of delay gates 26b, line BD__ will remain high, rather than making a transition to a low logic level as it otherwise would have (as shown in FIG. 2 by the dashed lines) if terminal A had remained at a high logic level until the delay time $t_d$ had elapsed. With line BD__ remaining at a high logic level and with line B returning low, line P at the output of NAND gate 22b will return to a high logic level. Also at this time, however, line P__ at the output of NAND gate 22a returns to a low logic level as line B_ returns high responsive to terminal A returning low. Accordingly, line ATD remains at a high logic level due to the rapid return of terminal A to a low logic level, with the high logic level pulse on line ATD being for a longer time than in normal operation.

At time $t_9$, line AD follows terminal A to a low logic level, delayed by delay stage 16. Since pass gate 18 has remained in the off condition due to line ATD remaining high, pass gate 18 has been off during the entire pulse of line AD resulting from the spurious pulse at terminal A, and the prior low logic level which was latched by latch 30 has been maintained at output line $A_{out}$. Upon the expiration of the delay time $t_d$ through delay stages 24a and 26a from the return transition of line B to a high logic level at the end of the spurious pulse, line BD returns to a low logic level. With line B_ already at a high logic level, line P at the output of NAND gate 22a then returns to a high logic level, causing line ATD at the output of NAND gate 28 to return low and turn on pass gate 18 at time $t_{10}$. Since line AD has already returned to its prior low logic level, the prior state of latch 30 is maintained, and no transition at the output on line $A_{out}$ appears.

As a result of this construction of the input buffer of FIG. 1, the spurious pulse at terminal A occurring between times $t_5$ and $t_8$, and appearing at line AD, does not appear at output line $A_{out}$ of the input buffer of FIG. 1. It should be noted that the delay through delay stage 16 is preferably less than delay $t_d$ (the sum of the delays through delay stages 24 and 26 for a given leg of ATD circuit 20), so that the spurious pulse at terminal A appearing at line AD is over by the time that pass gate 18 is turned back on by line BD returning to a low logic level.

Figure 2:
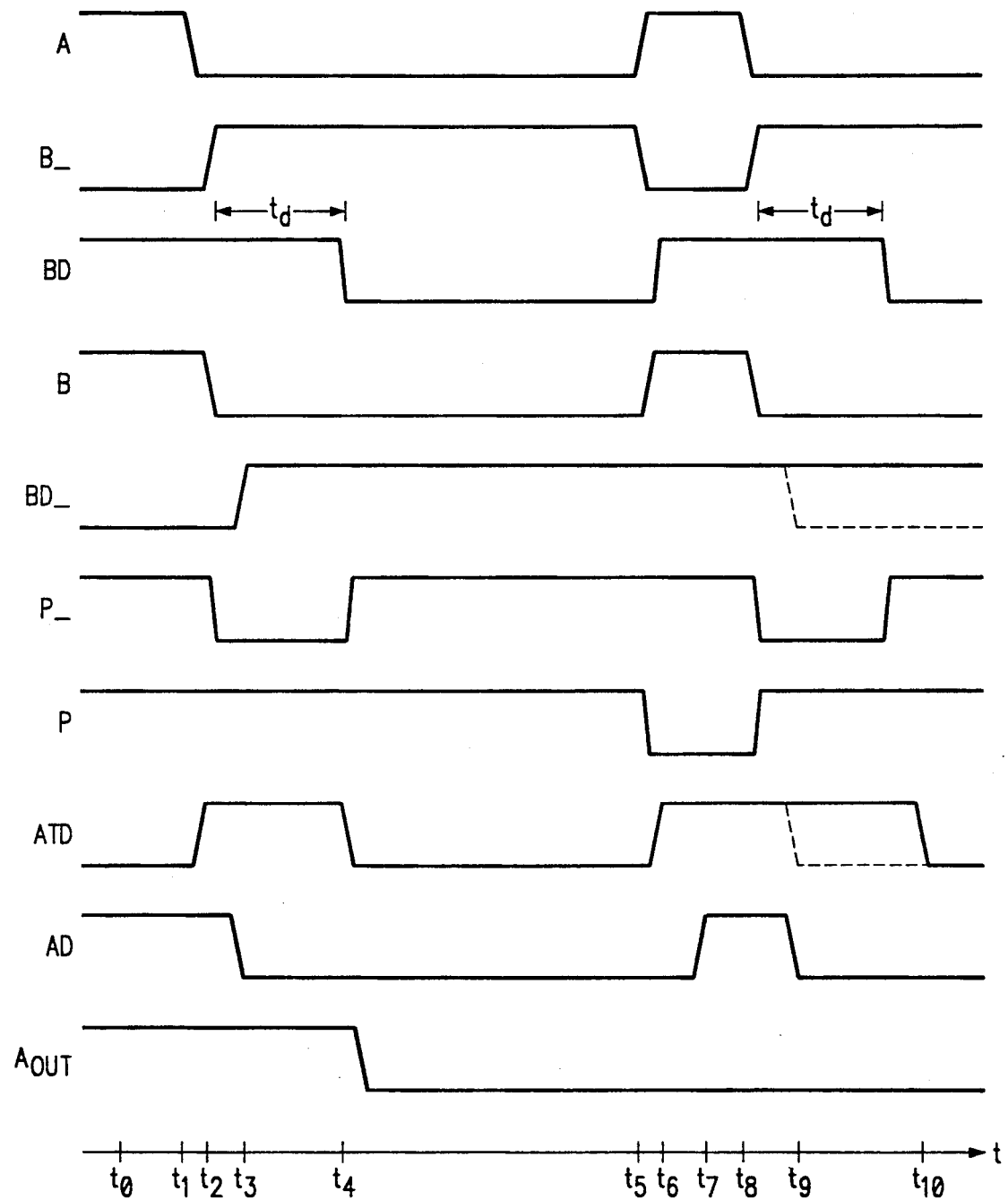
FIG. 2 is a timing diagram illustrating the operation of the input buffer circuit of FIG. 1.

The operation of the input buffer of FIG. 1 for transitions at terminal A of opposite polarity (i.e., high-to-low) from that shown in the first cycle of FIG. 2 is, of course, similar to that shown in FIG. 2. For such transitions, the delay $t_d$ of delay gates 24b and 26b will control the length of the ATD pulse, in similar manner as delay gates 24a and 26a in the example of FIG. 2. Spurious high-to-low pulses at terminal A will, of course, similarly be ignored by the input buffer of FIG. 1 as the spurious low-to-high pulse in the example of FIG. 2.

The input buffer of FIG. 1 thus is constructed in such a manner that an ATD pulse is quickly generated on line ATD by ATD circuit 20 for any transition at the associated terminal, and in such a manner that the end of the ATD pulse controls the output of the input buffer so that short, and presumably spurious, pulses at the input terminals are rejected by the input buffer. As a result, race conditions which can cause such problems as multiple selection of word lines in an SRAM are prevented by the input buffer of FIG. 1. In addition, the address hold time for write operations is, in effect, guaranteed against failure by the input buffer of FIG. 1, as invalid address transitions are not inadvertently decoded during the performance of a write operation. Furthermore, the operation of the input buffer of FIG. 1 limits the amount of internal noise generated as a result of noise appearing at address terminals, reducing the likelihood of incorrect switching at the output terminals, and the possible oscillation resulting therefrom.

In addition to improved immunity to noise at input terminals, an integrated circuit including the input buffer according to the invention also allows for optimization of certain specification parameters, for example set-up and hold times, since transitions at the address terminals, for example, are delayed from application to the remainder of the circuit until after the ATD pulse is complete. Accordingly, the actual address hold time specification for a circuit incorporating this invention may be less than that for circuits not incorporating the input buffer of this invention. Furthermore, the preclusion of certain race conditions resulting from the circuit according to the invention facilitates design of the integrated circuit itself, as the internal timing constraints are much reduced.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An input buffer circuit having an output for communicating a signal corresponding to the logic level of a signal received at an input terminal, comprising:
    a transition detection circuit having an input coupled to said input terminal, and having an output for presenting a pulse responsive to detection of a logic level transition at said input terminal;
    a latch, having an input and an output, the output of said latch coupled to the output of said input buffer circuit; and
    a pass gate coupled between said input terminal and the input of said latch, said pass gate controlled by the output of said transition detection circuit so that the pass gate is nonconductive during such time as the output of said transition detection circuit presents said pulse.

2. The input buffer circuit of claim 1, wherein said input terminal is an address terminal.

3. The input buffer circuit of claim 1, further comprising:
    a delay gate coupled between said input terminal and said pass gate.

4. The input buffer circuit of claim 1, wherein said transition detection circuit comprises:
    a first leg, comprising:
        a logic function having a first input coupled to said input terminal; and
        a delay gate, coupled between said input terminal and a second input of said logic function;
    a second leg, comprising:
        a logic function having a first input coupled to said input terminal in a complementary manner relative to the coupling of said input terminal to said first input of said logic function of said first leg; and
        a delay gate, coupled between said input terminal in a complementary manner relative to the coupling of said input terminal to said delay gate of said first leg and a second input of said logic function; and
    an output logic function, having inputs coupled to the outputs of said logic functions in said first and second legs, and having an output for presenting said pulse.

5. The input buffer of claim 4, further comprising:
    a delay stage coupled between said input terminal and said pass gate.

6. The input buffer of claim 5, wherein the delay of said delay stage is less than the delay in said delay gates of said transition detection circuit.

7. The input buffer of claim 5, wherein the delay of said delay stage is of such a value that a transition at said input terminal reaches said pass gate after said transition detection circuit presents said pulse at its output.

8. A method for controlling the buffering of an input signal at a terminal of an integrated circuit, comprising:
detecting a logic level transition of said input signal from a first logic level to a second logic level;
generating a pulse responsive to detection of a logic level transition of said input signal;
after the beginning of said pulse, isolating said terminal from a latch, said latch having an output coupled to a node of said integrated circuit for presenting thereat a signal corresponding to said input signal; and
after the end of said pulse, coupling said terminal to said latch.

9. The method of claim 8, wherein said logic level transition of said input signal corresponds to a new operating cycle of said integrated circuit.

10. The method of claim 9, wherein, prior to said pulse, said latch presents, at its output, a signal corresponding to an input signal received in a prior operating cycle.

11. The method of claim 8, wherein said isolating step is performed by controlling a pass gate coupled between said input terminal and said latch;
and further comprising:
delaying said input signal; and
applying said delayed input signal to said pass gate after the beginning of said isolating step.

12. The method of claim 8, further comprising:
applying said pulse to other portions of said integrated circuit.

13. The method of claim 8, wherein said integrated circuit is a static read/write memory.

14. The method of claim 8, wherein said generating step comprises:
initiating said pulse responsive to detecting said logic level transition; and
terminating said pulse responsive to a first selected delay after detecting said logic level transition.

15. The method of claim 14, further comprising:
after said step of initiating said pulse, detecting a second logic level transition of said input signal from said second logic level to said first logic level prior to said selected delay time expiring; and
responsive to detecting said second logic level transition, delaying said terminating step for a second selected delay after said second logic level transition.

16. The method of claim 15, wherein said isolating step is performed by controlling a pass gate coupled between said input terminal and said latch;
and further comprising:
delaying said input signal; and
applying said delayed input signal to said pass gate after said initiating step.

17. The method of claim 16, wherein the delaying of said input signal is for a time shorter than the first selected delay.

18. An input buffer circuit for buffering the application of an input signal to a terminal of an integrated circuit, comprising:
means for detecting a logic level transition of said input signal and for producing, at an output, a signal responsive to a logic level transition of said input signal;
a latch, having an input and an output, said output of said latch coupled to a node in said integrated circuit for presenting thereat a signal corresponding to said input signal; and
a pass gate, coupled between said terminal and the input of said latch, and having a control terminal coupled to the output of said detecting means, for isolating said terminal from the input of said latch responsive to said detecting means detecting a logic level transition of said input signal.

19. The circuit of claim 18, wherein said signal produced by said detecting means comprises a pulse;
and wherein said pass gate isolates said terminal from the input of said latch during said pulse.

20. The circuit of claim 19, further comprising:
means for delaying said input signal, coupled between said terminal and said pass gate.

21. The circuit of claim 20, wherein said detecting means comprises:
first and second delay chains, each coupled to said terminal, said first delay chain for presenting a signal responsive to a positive-going logic level transition of said input signal, and said second delay chain for presenting a signal responsive to a negative-going logic level transition of said input signal; and
a logic circuit having first and second inputs coupled to said first and second delay chains, respectively, for presenting a pulse at its output responsive to a signal from one of said first and second delay chains, and for extending said pulse responsive to receiving a signal from the other of said first and second delay chains corresponding to receipt of a second logic level transition of said input signal occurring during said pulse.

* * * * *